United States Patent [19]
Ohtomo et al.

[11] Patent Number: 6,084,896
[45] Date of Patent: Jul. 4, 2000

[54] LASER LIGHT-SOURCE APPARATUS AND METHOD OF PRODUCING LIGHT BEAM

[75] Inventors: Fumio Ohtomo; Hiroshi Koizumi; Masayuki Momiuchi; Masahiro Ohishi; Yoshiaki Goto, all of Tokyo, Japan

[73] Assignee: Kabushiki Kaisha Topcon, Tokyo, Japan

[21] Appl. No.: 08/782,591

[22] Filed: Jan. 13, 1997

[30] Foreign Application Priority Data

Jan. 12, 1996 [JP] Japan .................................. 8-021807

[51] Int. Cl.⁷ ...................................... H01S 3/00
[52] U.S. Cl. ............................... 372/38; 372/25
[58] Field of Search ........................ 372/38, 25

[56] References Cited

U.S. PATENT DOCUMENTS

| | | | |
|---|---|---|---|
| 5,406,577 | 4/1995 | Gagosz | 372/25 |
| 5,445,146 | 8/1995 | Bellinger | 607/89 |
| 5,755,752 | 5/1998 | Segal | 607/89 |

*Primary Examiner*—Teresa M. Arroyo
*Assistant Examiner*—Robert E. Wise
*Attorney, Agent, or Firm*—Baker Botts L.L.P.

[57] ABSTRACT

The present invention relates to a laser light-source apparatus and a method of producing a laser beam, and particularly to a laser light-source apparatus capable of generating intermittent pulse light having a predetermined flickering time and emphasizing the brightness of its peak by a Bartley effect. A timing circuit forms a timing signal so as to allow an excitation type laser light source to produce the intermittent pulse light having the predetermined flickering time. A pumping laser pumps the excitation type laser light source based on the signal outputted from the timing circuit. The intermittent pulse light is flickering slower than a flicker value of a normal person in cycle. The time required to put out the intermittent pulse light is set to a time or so required to restore the sensitivity of each of human eyes to the maximum sensitivity after the human eyes have felt brightness since light has been launched into the human eyes.

6 Claims, 14 Drawing Sheets

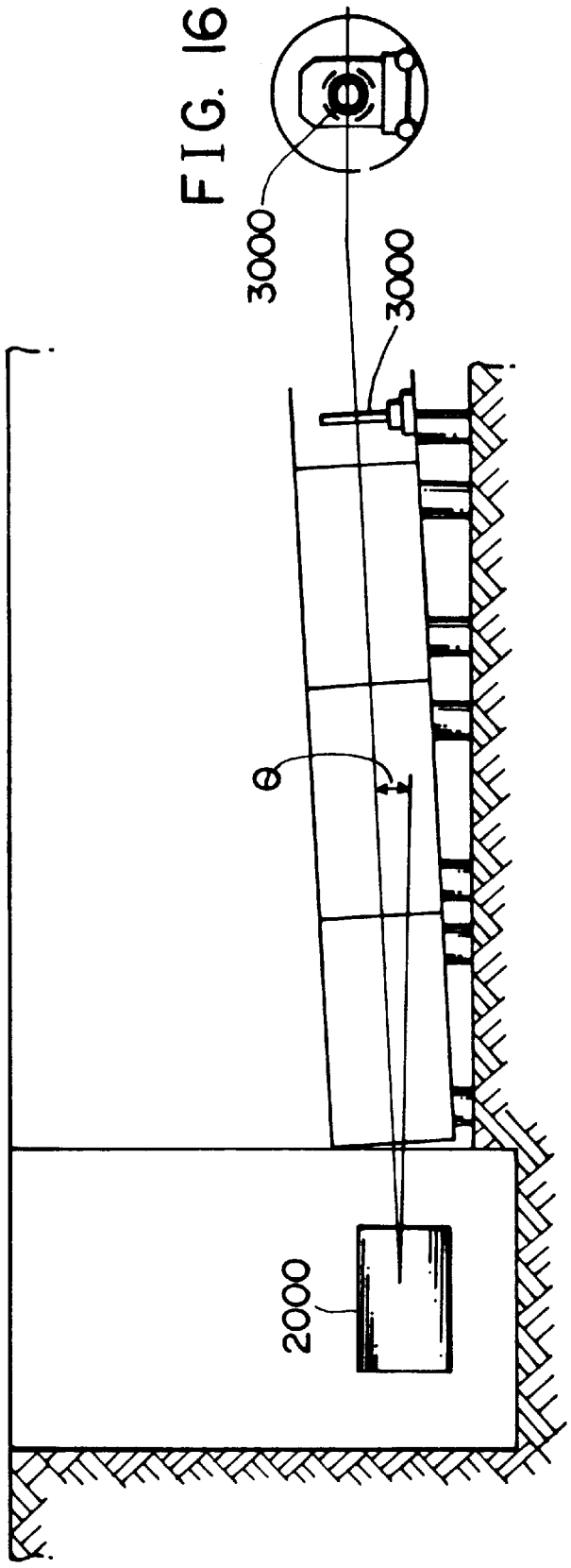

LASER LIGHT-SOURCE APPARATUS AND METHOD OF PRODUCING LIGHT BEAM

BACKGROUND OF THE INVENTION

1. Field of the Invention

The present invention relates to a laser light-source apparatus and a method of producing a laser or light beam therefrom, and particularly to a laser light-source apparatus capable of generating intermittent pulse light having a predetermined flickering time and emphasizing the brightness of its peak by a Bartley effect and a method of producing a laser or light beam from the laser light-source apparatus.

2. Description of the Related Art

A laser irradiating device for radiating an object with a laser beam has heretofore been proposed in various forms. The range of uses for the laser irradiating device has recently been increased and rapidly widespread.

In general, these laser irradiating devices have adopted continuously-produced laser beams.

However, the conventional laser irradiating device has a problem that although problems are relatively reduced when the laser irradiating device irradiates an object being at no great distance with light, light is diffused so as to attenuate irradiation light when it radiates an object being at great distance with the light.

The attenuation of the irradiation light will cause a problem that a user has difficulty in recognizing the attenuation of the irradiation light and encounters extreme difficulties in recognizing it particularly during the daytime in which surroundings are bright, whereby the efficiency of work is reduced.

An increase in the output of a light source is considered to solve the attenuation of the irradiation light. However, a problem arises that the influence of a laser beam on a human body increases so as to raise the risk and power consumption is increased.

Further, a significant problem arises that an increase in laser beam output causes an increase in protective equipment to thereby lead to an increase in cost and the handling of the laser irradiating device becomes troublesome.

With the foregoing problems in view, the present invention provides a laser light-source apparatus comprising:

a laser light source; and drive means for driving the laser light source so that intermittent pulse light having a predetermined flickering time is produced from the laser light source, and wherein the intermittent pulse light is flickering slower than a flicker value of a normal person in cycle, and the time required to put out the pulse light is set to a time or so required to restore the sensitivity of each of human eyes to the maximum sensitivity after the human eyes have felt brightness since light has been launched into the human eyes.

Further, the present invention provides a laser light-source apparatus comprising:

an excitation type laser light source;

a timing circuit for forming a timing signal for allowing the excitation type laser light source to generate intermittent pulse light having a predetermined flickering time; and a pumping laser for pumping the excitation type laser light source based on the signal outputted from the timing circuit, and wherein the intermittent pulse light is flickering slower than a flicker value of a normal person in cycle and the time required to put out the intermittent pulse light is set to a time required to restore the sensitivity of each of human eyes to the maximum sensitivity after the human eyes have felt brightness since light has been launched into the human eyes.

According to the present invention, the predetermined flickering time can be also set to a frequency at which an emphasizing effect of the flickering light is obtained by a Bartley effect.

Further, according to the present invention, the predetermined flickering time may range from 6 Hz to 15 Hz.

The intermittent pulse light employed in the present invention may be set so that the light putting-out time is represented as substantially 2T if a lighting-on time is defined as T.

Moreover, the present invention provides a method of producing a laser beam emitted from a laser light source as intermittent pulse light corresponding to flickering slower than a flicker value of a normal person in cycle and having such a flickering time that a light putting-out time reaches a time or so for restoring the sensitivity of each of human eyes to the maximum sensitivity after the human eyes have felt brightness since light has been launched into the human eyes.

SUMMARY OF THE INVENTION

In one aspect of the present invention, there is thus provided a laser light-source apparatus comprising an excitation type laser light source, a timing circuit and a pumping laser. The timing circuit forms a timing signal so as to allow the excitation type laser light source to produce intermittent pulse light having a predetermined flickering time. The pumping laser pumps the excitation type laser light source based on the signal outputted from the timing circuit. The intermittent pulse light is flickering slower than a flicker value of a normal person in cycle. The time required to put out the intermittent pulse light is set to a time or so required to restore the sensitivity of each of human eyes to the maximum sensitivity after the human eyes have felt brightness since light has been launched into the human eyes.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

The present invention will now be described with reference to the accompanying drawings wherein:

FIG. 8 is a diagram typically showing a gain switch, in which

FIG. 16 is a diagram showing a still further applied example.

DETAILED DESCRIPTION OF THE PREFERRED EMBODIMENTS

Preferred embodiments of the present invention will hereinafter be described in detail with reference to the accompanying drawings.

[Principle]

A slight description will now be made of the principle of the present invention.

Figure 7:
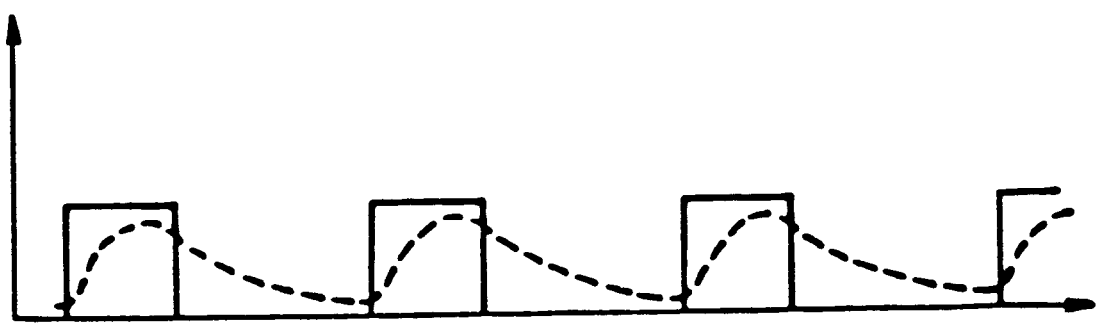
FIG. 7 is a diagram for describing the principle of the present invention.

When a light source emits light, the human eyes are able to momentarily recognize the light. However, the recognition of the light by the eyes is thereafter discursively reduced so that the eyes feel a glow remaining where the light has disappeared. In general, the human eyes are easy to recognize a light flickering or blinking source rather than a continuously-light emitting source. This state is shown in FIG. 7. In FIG. 7, a solid line indicates a pulse-driven laser beam or light and a dotted line indicates a human eye's response to a light pulse.

Namely, when the light source is turned off, the human eyes are restored to the maximum sensitivity again after the elapse of a predetermined time.

Thus, in order to give a stimulus to the human eyes at the maximum sensitivity, intermittent driving for emitting the next light pulse may be performed after the elapse of a predetermined time in a state in which the sensitivity of each eye is restored to the maximum sensitivity.

Incidentally, the normal human can recognize blinking or flickering with a frequency range of 40 Hz to 50 Hz as the boundary. It is necessary to make blinking or flickering delayed in cycle as compared with a flicker value of the human.

According to an experiment, the most recognizable flickering has been found to be a frequency range of 6 Hz to 15 Hz owing to a combination of pulse driving and flickering. Incidentally, a phenomenon in which the brightness of the peak is sensed with emphasis when the frequency of flicker light is about 10 Hz, is called "Bartley Effect" or also called "Brucke-Bartley Effect".

According to the Bartley Effect, it is known that the maximum effect can be obtained when the ratio between a lighting time and a lighting-out time is represented as 1:1. This means that the visibility of the human eyes reaches the maximum value during a lighting time of 50 msec and the visibility thereof is restored to the maximum sensitivity during a lighting-out time of 50 msec. A stimulus based on the next light pulse can be effectively given to the human eyes by setting the lighting-out time to 50 msec or more.

When the lighting time of the light source is made long, the visibility of the human eyes is reduced. It is generally known that the peak occurs in the vicinity of a time range from 50 msec to 120 msec after light-production and thereafter gradually decreases so as to gradually reach a predetermined value. The ratio between the visibility and the drive power of the light source can be set most satisfactorily by setting the light-producing time to the time range of about 50 msec to 120 msec.

[First Embodiment]

Figure 1:
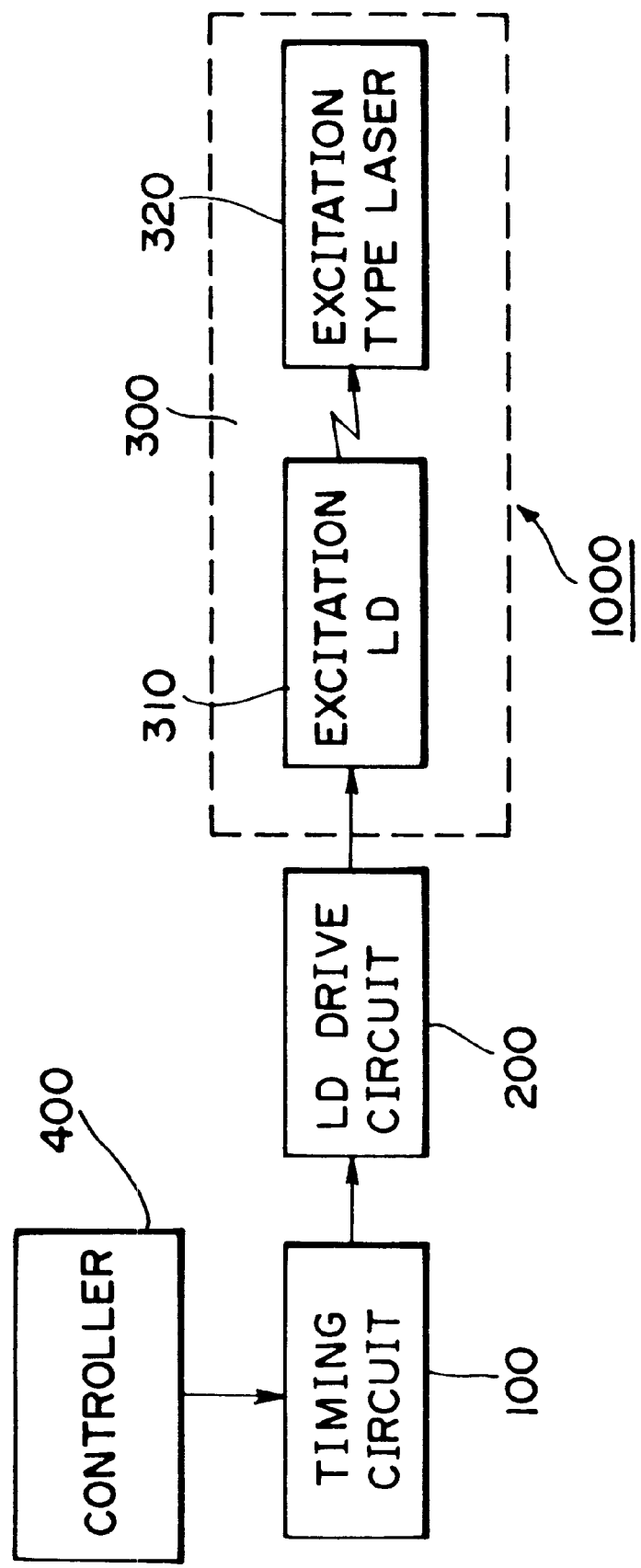
FIG. 1 is a diagram showing a laser oscillating apparatus 1000 according to a first embodiment of the present invention.

FIG. 1 shows an electrical configuration of a laser oscillating apparatus 1000 according to a first embodiment of the present invention. The laser oscillating apparatus 1000 comprises a timing circuit 100, a laser diode drive circuit 200, a laser beam or light source 300 and a controller 400.

The timing circuit 100 is used for controlling and driving the laser diode drive circuit 200 so as to generate intermittent pulse light having a predetermined flickering time from the laser light source 300.

The laser diode drive circuit 200 corresponds to a drive means which drives the laser light source 300 based on a control signal produced from the timing circuit 100.

The laser light source 300 is used to generate the intermittent pulse light having the predetermined flickering time. The laser light source 300 employed in the first embodiment is of an excitation type laser light source, which comprises an excitation laser means 310 and an excitation type laser 320 composed of an optical resonator. Incidentally, the excitation laser means 310 corresponds to a pumping laser.

The excitation laser means 310 serves as a pump light-producing device. The excitation type laser 320 causes light to travel between a dielectric reflection film and an output mirror so as to enclose the light for a long time, thereby making it possible to resonate and amplify the light.

Incidentally, a semiconductor laser is adopted as the excitation laser means 310 employed in the first embodiment. However, any ones may be adopted if devices capable of emitting a laser beam are used.

Further, the laser light source 300 is not limited to the excitation type laser. Any means may be adopted if capable of generating a laser beam.

The controller 400 performs the entire control of the laser oscillating apparatus 1000 including the timing circuit 100 and is composed of an arithmetic processing unit including a CPU.

Figure 2:
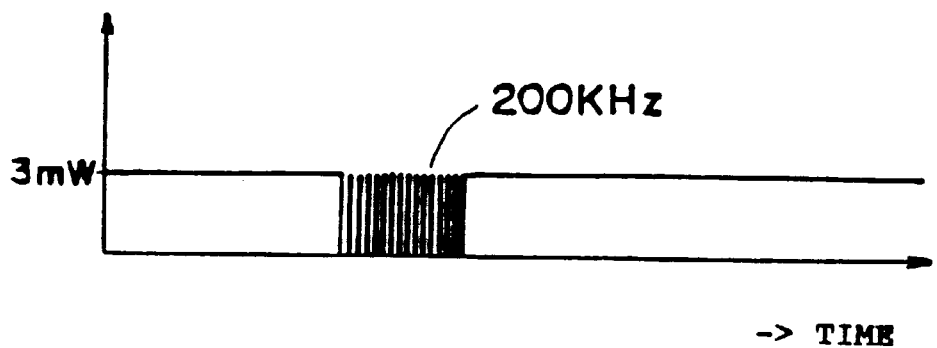
FIG. 2 is a diagram for describing a state of oscillations of a laser.

According to the present embodiment constructed as described above, the laser light source 300 can generate a 3 mW laser beam having 200 KHz as shown in FIG. 2. As will be described in the paragraph [Laser Light Source] about the pulse emission, power-thrifty can be achieved.

Figure 3:
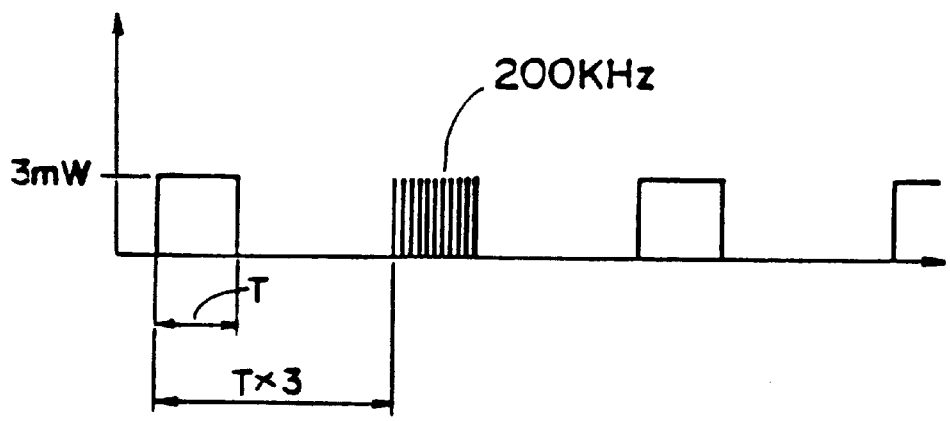
FIG. 3 is a diagram for describing another state of oscillations of the laser.

As shown in FIG. 3, the timing circuit 100 drives the laser diode drive circuit 200 in such a way that the time T required to emit or produce a light pulse is set as, for example, 30 ms, the time for putting out lights is set as 2T and one period or cycle is set to 3T.

Namely, the light-pulse emitting time T is set so as to substantially coincide with the time during which the feeling of brightness by the human eyes becomes a maximum after light has entered into the human eyes. The lighting-out time is set so as to substantially coincide with the time for restoring the sensitivity of each eye to the maximum sensitivity after the human eyes has felt the brightness of the light since the light was launched into the human eyes.

Further, the lighting-out time is set to about twice the time required to emit or produce the light pulse in order to further reduce power consumed by a pumping laser for pumping an excitation type laser light source. In the present embodiment, the lighting time is 47 msec and the lighting-out time is 94 msec. However, they are not necessarily limited to these times and can be suitably changed respectively.

As a result, a pulsed laser beam is launched into the human eyes in a state in which the eye's sensitivity is of highest. Therefore, the visibility or visual recognition becomes extremely easy. An average output becomes 1 mW or so even though the visibility is easy, and safety against a human body can be further improved. Further, the power consumed by the pumping laser for pumping the excitation type laser light source becomes one-third so that power consumption can be reduced.

In the case of a continuously-emitted laser beam, the control on equipment for the safety against the laser beam is relatively reduced if an output specification falls below 1 mW. It is however difficult to visually observe or recognize the laser beam in a bright location. On the other hand, if a laser beam is intermittently emitted in the form of a rectangle as shown in FIG. 3, then the laser beam can be used under relatively low control over the protection of the human body against the laser beam if the quantity of light produced within a predetermined time interval is 1 mW or less. Thus, the visibility is improved even in the bright location.

Figure 4:
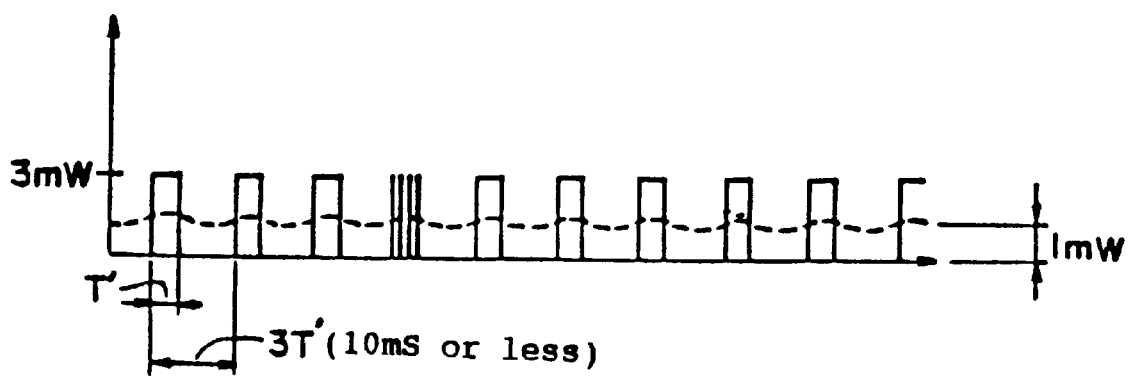
FIG. 4 is a diagram for describing a further state of oscillations of the laser.

As shown in FIG. 4, the timing circuit 100 is constructed in such a manner that the time required to emit or produce the light pulse is set as T', the lighting-out time is set as 2T' and one cycle is set as 3T'. Alternatively, 3T' corresponding to one cycle can be also set to 10 ms or less. In this case, the average output of a laser beam becomes 1 mW or so.

However, when the cycle of the laser beam intermittently produced in the form of the rectangle is short, the laser beam is visually recognized in such a way that it is averaged over its entirety. It is however possible to obtain the effect of achieving power-thrifty even in the case of the same visibility when a light pulse is emitted.

A further effect can be obtained if the pulse continuously driving, the intermittent pulse driving and the intermittent pulse driving at one cycle of 10 ms or less are changed according to the need on a working site.

[Second Embodiment]

Figure 5:
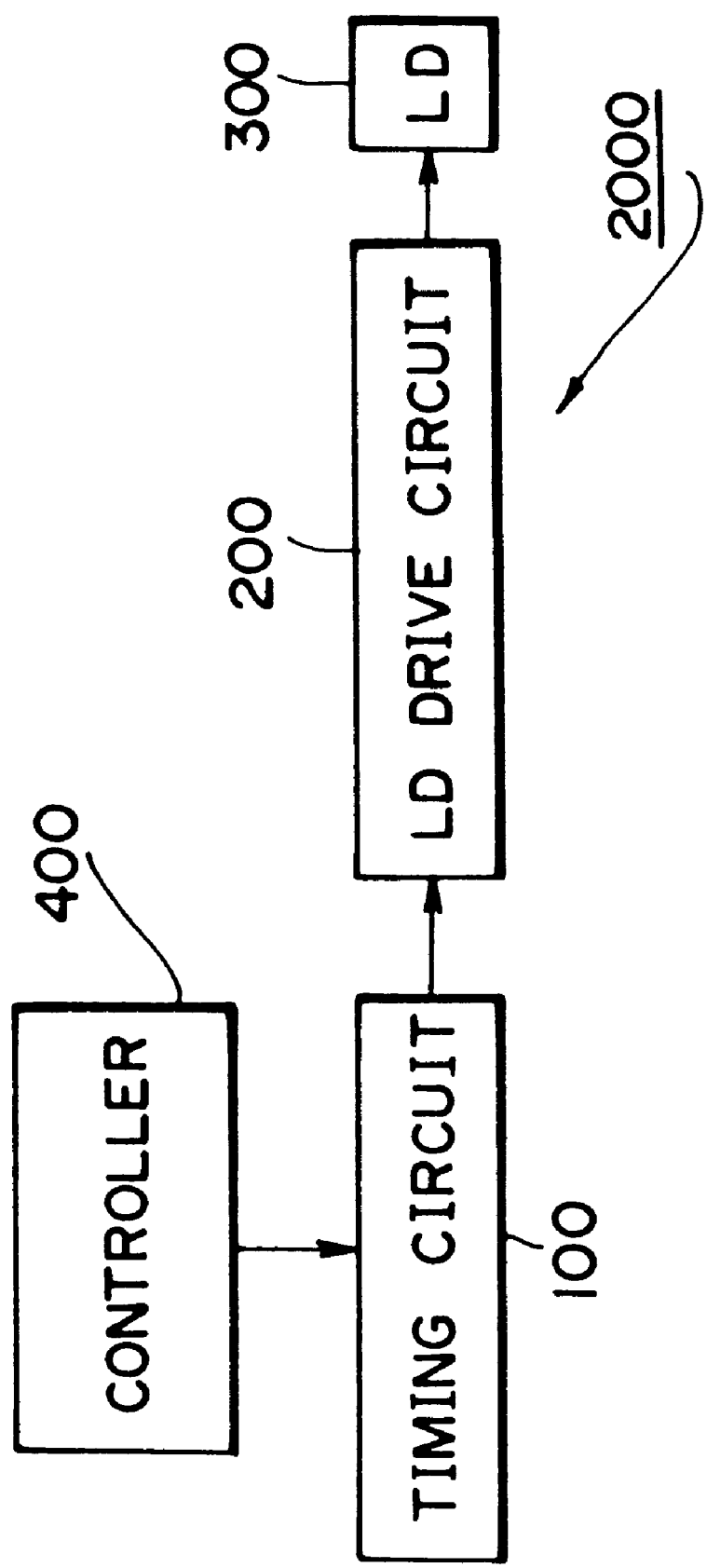
FIG. 5 is a diagram illustrating a laser oscillating apparatus 2000 according to a second embodiment of the present invention.

Modifications of the electrical configuration of the laser oscillating device 100 according to the first embodiment will next be described. FIG. 5 is a diagram for describing a second embodiment of the present modifications and illustrates an electrical configuration of a laser oscillating apparatus 2000. The laser oscillating apparatus 2000 comprises a timing circuit 100, a laser diode drive circuit 200, a laser beam or light source 300 and a controller 400.

The laser light source 300 employed in the first embodiment adopts the excitation type laser, whereas a normal laser diode is adopted as the laser light source 300 as an alternative to the excitation type laser in the second embodiment. Semiconductor lasers of any type can be used as the laser diode.

Incidentally, other components employed in the second embodiment are identical in operation, effect or the like to those employed in the first embodiment and their description will therefore be omitted.

[Third Embodiment]

Figure 6:
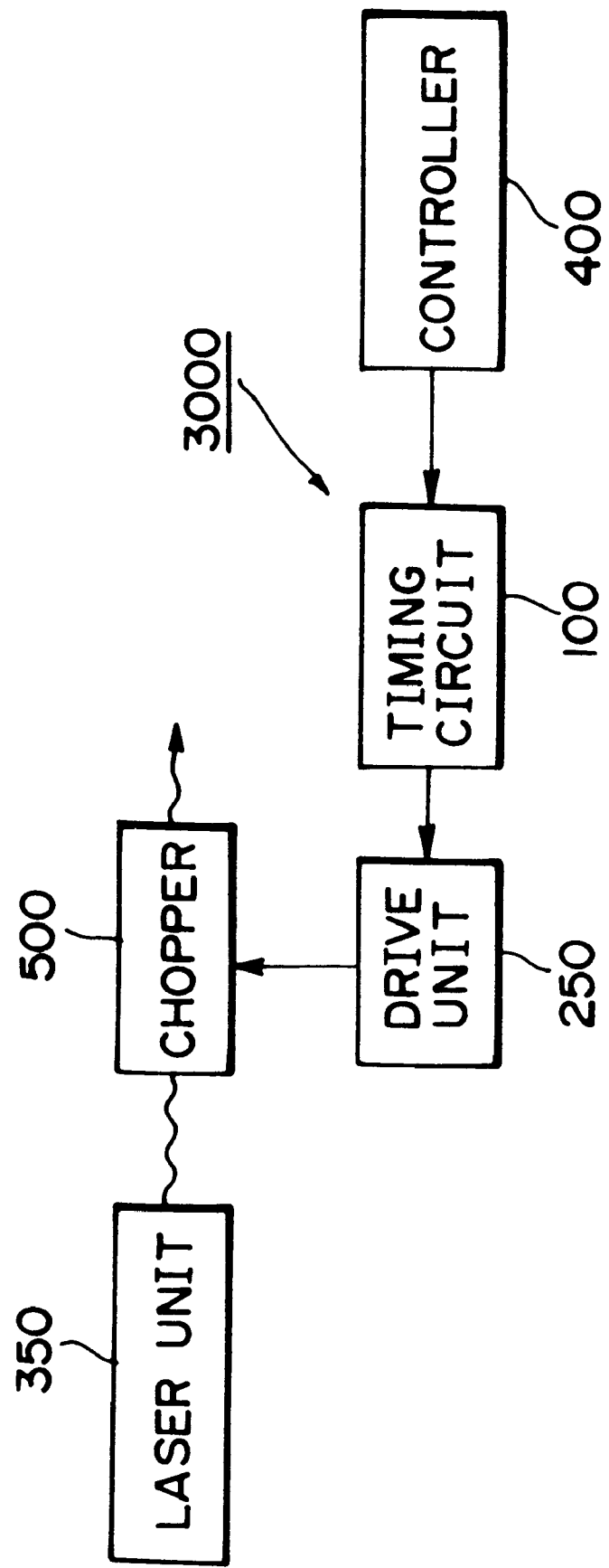
FIG. 6 is a diagram showing a laser oscillating apparatus 3000 according to a third embodiment of the present invention.

FIG. 6 is a diagram for explaining a third embodiment of the present modifications and shows an electrical configuration of a laser oscillating apparatus 3000. The laser oscillating apparatus 3000 comprises a timing circuit 100, a driver or drive unit 250, a laser unit 350, a controller 400 and a chopper means 500.

In the third embodiment, the laser unit 350 sequentially generates a laser pulse beam and the chopper means 500 converts it into an intermittent pulse beam or light having a desired flickering time.

The drive unit 250 is used to drive the chopper means 500.

The chopper means 500 can interrupt the pulse beam sequentially produced from the laser unit 350 so as to generate the intermittent pulse beam having the desired flickering time.

As the chopper means 500, a chopper device composed of a mechashutter, an AO (Acousto-Optical device), an EO (Electro-Optical device), etc. can be used.

The timing circuit 100 is used to determine the timing provided to activate the chopper means 500.

The controller 400 controls and drives the timing circuit 100 and activates the chopper means 500 through the drive unit 250.

The third embodiment constructed as described above can generate intermittent pulse light having a desired flickering time in a manner similar to the first and second embodiments.

Further, the laser unit 350 can adopt laser light sources of any type.

Incidentally, other components employed in the third embodiment are similar in operation, effect and the like to those employed in the first embodiment and their description will therefore be omitted.

[Laser Light Source]

The laser light source 300 employed in the first embodiment will now be described.

Figure 8A:
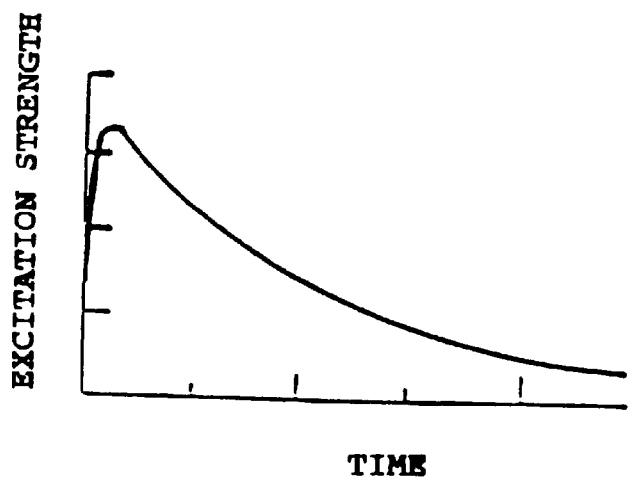
FIG. 8(a) shows the relationship between the time and an excitation strength.
Figure 8B:
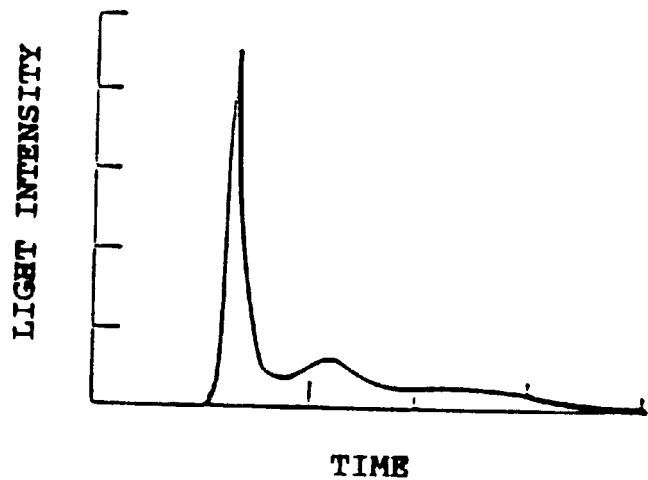
FIG. 8(b) illustrates the relationship between the time and a light intensity and FIG. 8(c) depicts the relationship between the time and an inverted population.
Figure 8C:
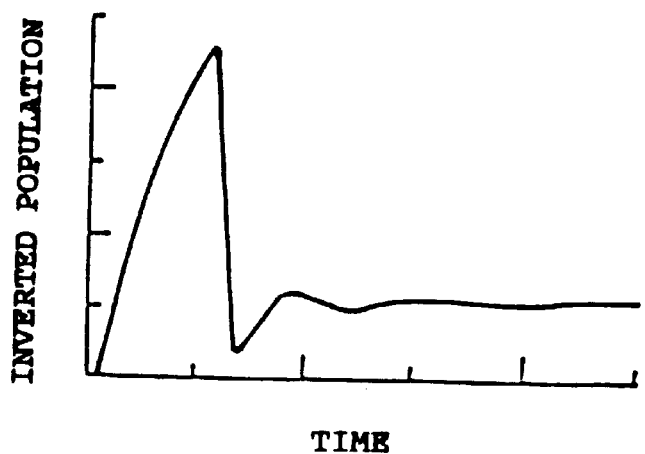

FIGS. 8(*a*), 8(*b*) and 8(*c*) are respectively typical diagrams showing gain switches. FIG. 8(*a*) shows the relationship between the time and an excitation strength. FIG. 8(*b*) illustrates the relationship between the time and a light intensity. FIG. 8(*c*) depicts the relationship between the time and an inverted population.

It is understood from observations of these drawings that the maximum light intensity occurs after the elapse of a predetermined excitation time.

Figure 9:
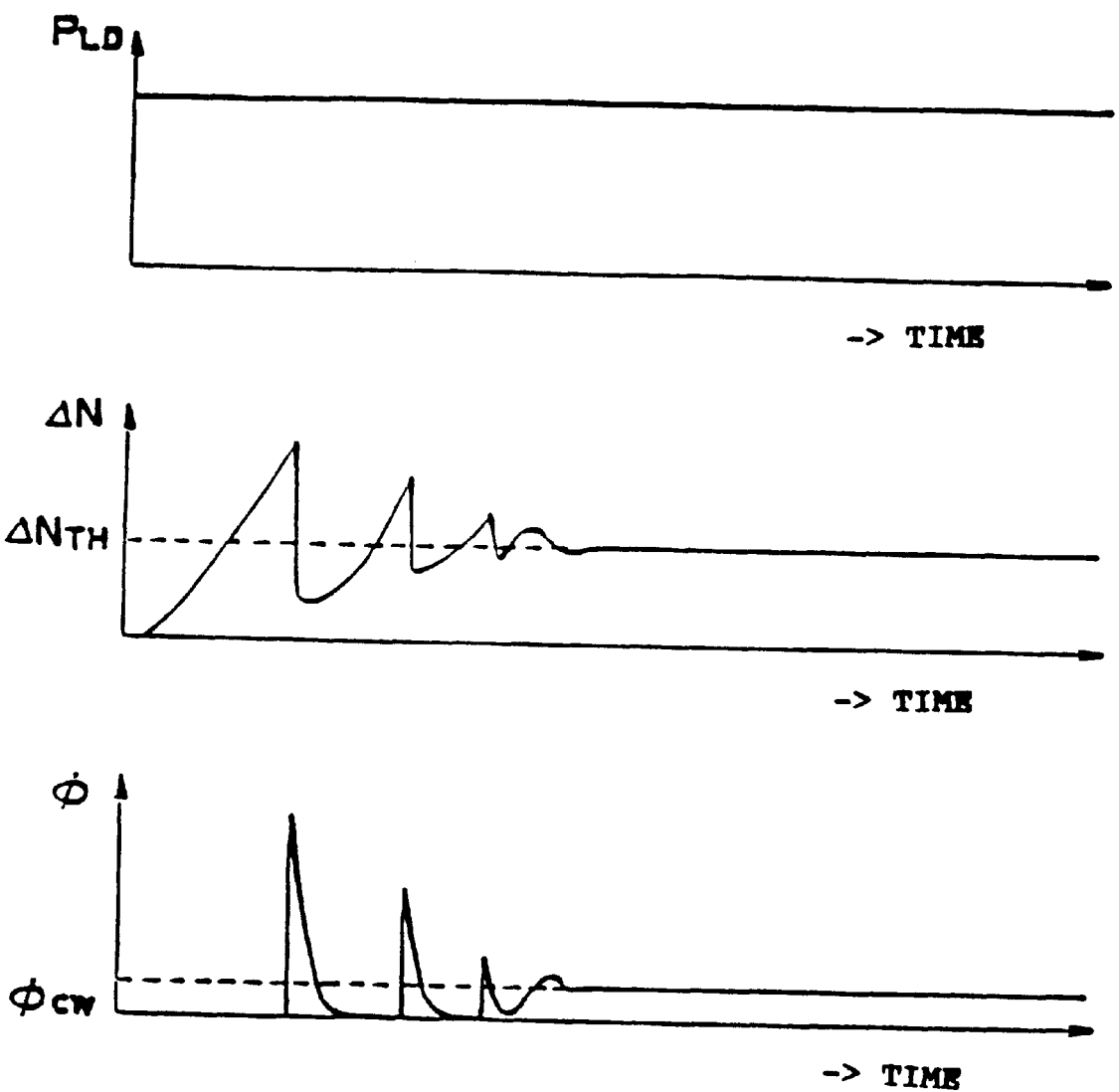
FIG. 9 is a diagram illustrating the relationship between an inverted population and a light intensity.

Next, an inverted population and a light intensity are respectively illustrated in FIG. 9 in separate form. If continuous-wave drive power is supplied to a semiconductor laser, then the maximum light intensity is produced in response to a first pulse and thereafter the light intensity is lowered so as to converge on a predetermined light intensity. It is therefore possible to take out light with most efficiency. Accordingly, only the first pulse will be used.

Figure 10:
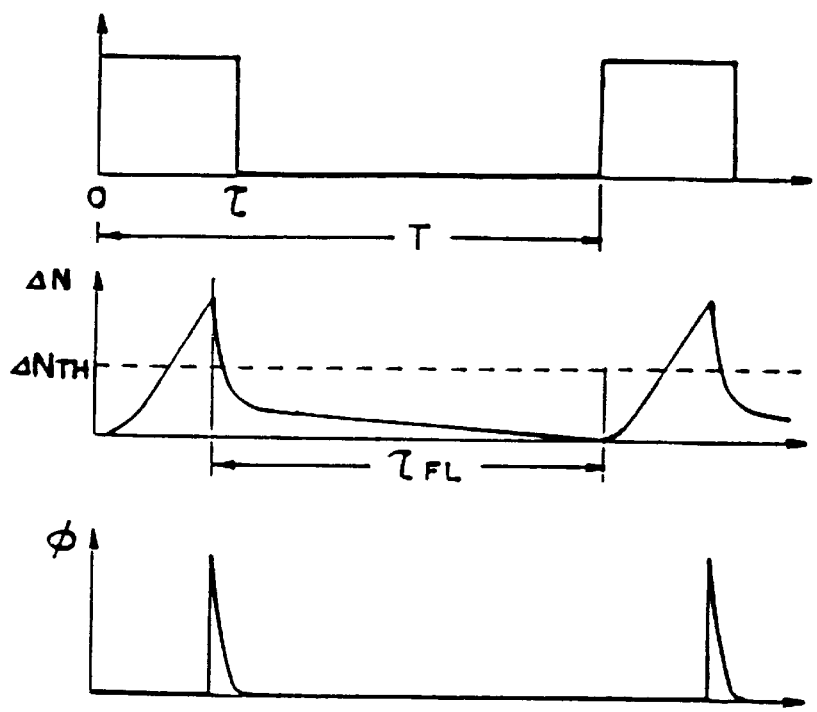
FIG. 10(a) is a diagram for describing a case in which a period T of a continuous pulse train supplied to a semiconductor laser satisfies the relations in $\tau_{FL} < T-\tau$.
FIG. 10(b) is a diagram for describing a case in which the period T of the continuous pulse train supplied to the semiconductor laser satisfies the relations in $\tau_{FL} > T-\tau$.
Figure 10:
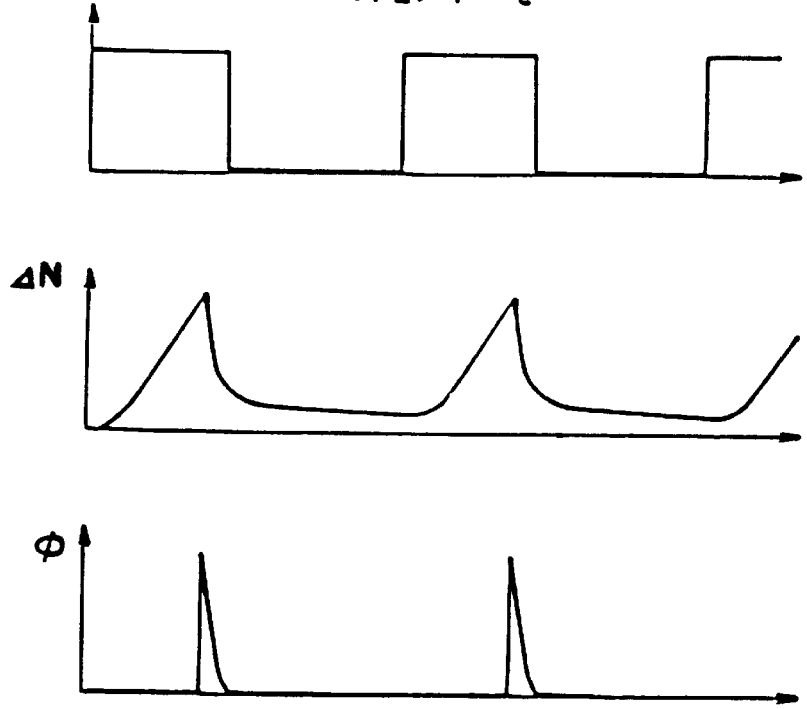

Referring to FIGS. 10(a) and 10(b), a further description will be made of the case in which drive power represented in the form of continuous pulses is supplied to a semiconductor laser.

FIG. 10(a) shows a case in which a period T of a continuous pulse train supplied to the semiconductor laser satisfies the relations in $\tau_{FL} < T - \tau$.

In contrast to this, FIG. 10(b) illustrates a case in which the period T of the continuous pulse train supplied to the semiconductor laser satisfies the relations in $\tau_{FL} > T - \tau$, where $\tau_{FL}$ is life of fluorescence and $\tau$ is a pulse width.

It is understood from FIG. 10(b) that when the next pulse is supplied to the semiconductor laser during $\tau_{FL}$ (life of fluorescence), a new inverted population is added to the remaining inverted population and only light having the maximum light intensity can be effectively continuously generated.

A description will next be made of the relationship between the output of a semiconductor laser and the output of the semiconductor laser at the time that a nonlinear optical medium 400 is inserted, on the basis of FIGS. 11(a) through 11(d).

Figure 11A:
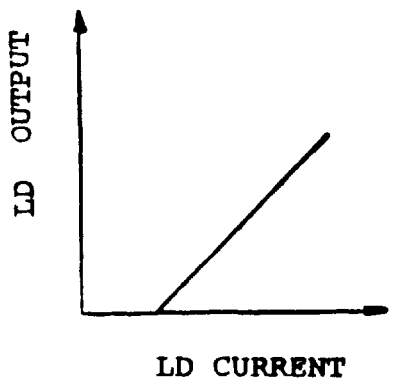
FIG. 11(a) is a diagram showing the relationship between the current consumed by the semiconductor laser and the output of the semiconductor laser.

FIG. 11(a) shows the relationship between the current consumed by the semiconductor laser and the output of the semiconductor laser. This relation is held linear after the flow of an offset current.

Figure 11B:
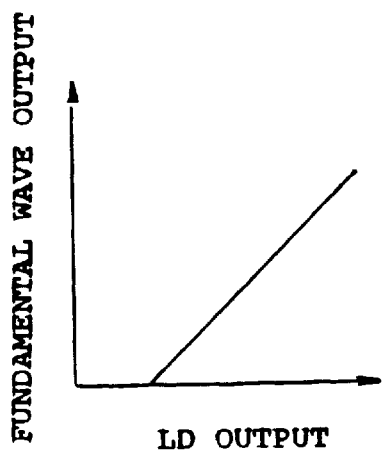
FIG. 11(b) is a diagram illustrating the relationship between the output of the semiconductor laser and a fundamental wave output in an optical resonator.

FIG. 11(b) illustrates the relationship between the output of the semiconductor laser and a fundamental wave output in an optical resonator. This relation is held linear after the flow of the offset current.

Figure 11C:
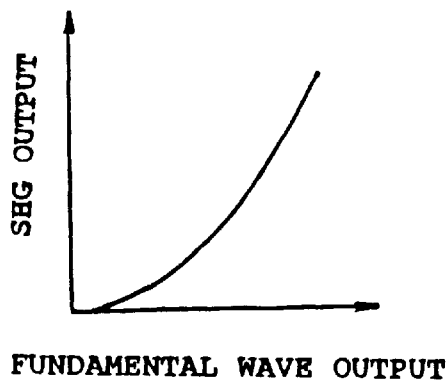
FIG. 11(c) is a diagram depicting the relationship between the fundamental wave output in the optical resonator and a second harmonic (SHG) output at the time that a nonlinear optical medium 400 is inserted into the optical resonator.
Figure 11:
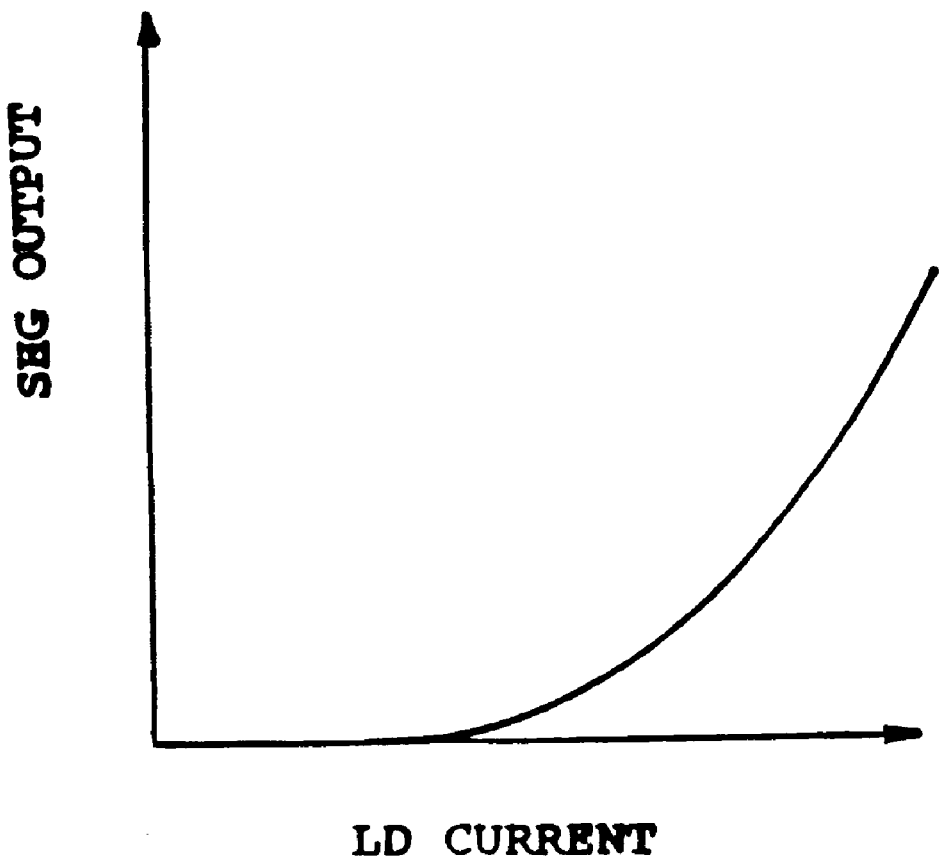
FIG. 11(d) is a diagram showing the relationship between the current consumed by the semiconductor laser and the second harmonic (SHG) output.

FIG. 11(c) depicts the relationship between the fundamental wave output in the optical resonator and a second harmonic (SHG) output at the time that the nonlinear optical medium 400 is inserted into the optical resonator. It is understood that the second harmonic (SHG) output is proportional to the square of the fundamental wave output in the optical resonator.

Accordingly, the second harmonic (SHG) output is proportional to the square of the current used up by the semiconductor laser as shown in FIG. 11(d).

Figure 12:
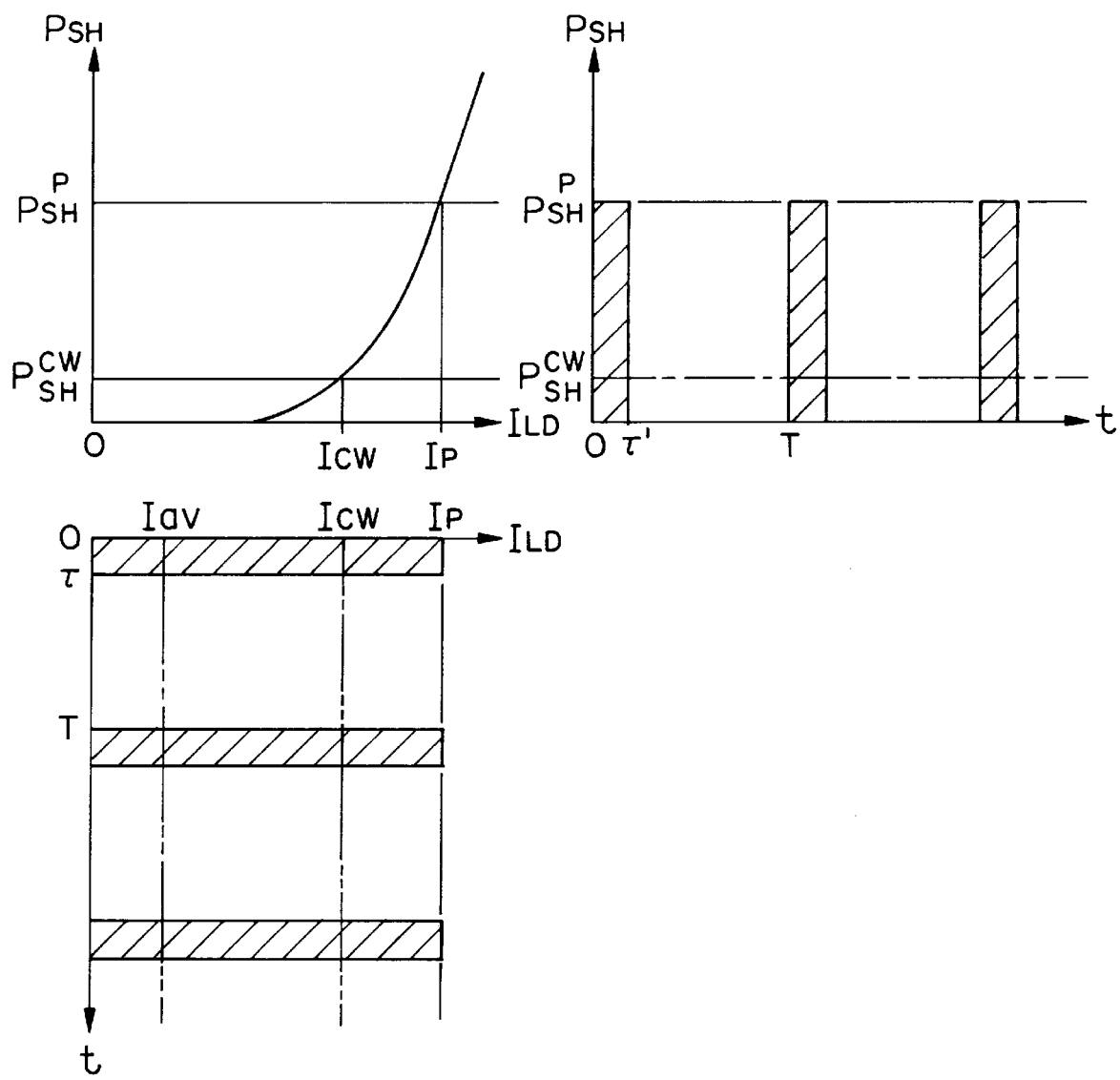
FIG. 12 is a diagram illustrating the comparison between a continuously-driven laser oscillating apparatus 1000 and a pulse-driven laser oscillating apparatus according to the present invention.

Thus, if the nonlinear optical medium is inserted into the optical resonator and the laser drive means drives the semiconductor laser serving as the laser light source 300 so that the next drive pulse is applied during $\tau_{FL}$ (life of fluorescence), then the semiconductor laser can be oscillated with high efficiency as shown in FIG. 12.

Namely, if the semiconductor laser corresponding to the laser light source 300 is driven in terms of a pulse width $\tau$, a pulse peak current $I_P$ and a pulse period T shown in FIG. 12, then a laser beam corresponding to a light pulse peak output $P^P_{SH}$ having a lightwave pulse width $\tau'$ is generated.

When the laser drive means continuously drives the laser light source 300 (when a continuous output $P^{CW}_{SH}$ identical to an average pulse output $P^{av}_{SH}$ is produced in this case), the second harmonic (SHG) output is proportional to the square of the current used up by the semiconductor laser if a continuous working current is regarded as $I_{CW}$. Therefore, only a laser beam corresponding to a continuous light output $P^{CW}_{SH}$ smaller than the light pulse peak output $P^P_{SH}$ is produced.

Further, since the laser light source 300 is intermittently activated when being pulse-driven, a comparison between the pulse-driven operation and the continuous operation will be made using the average value. An average pulse current at the time of the pulse-driven operation becomes $I_{av}$ and is smaller than the continuous working current $I_{CW}$.

Thus, if a semiconductor laser other than the excitation type laser is employed in the laser oscillating apparatus, then an advantageous effect can be brought about that a current of $I_{cw-av}$ can be saved when the laser light source is pulse-driven to generate a laser beam corresponding to an output identical to a continuous wave.

[Applied Examples]

Applied examples of the first through third embodiments will be described. The examples are those applied to a laser irradiating device.

Figure 13:
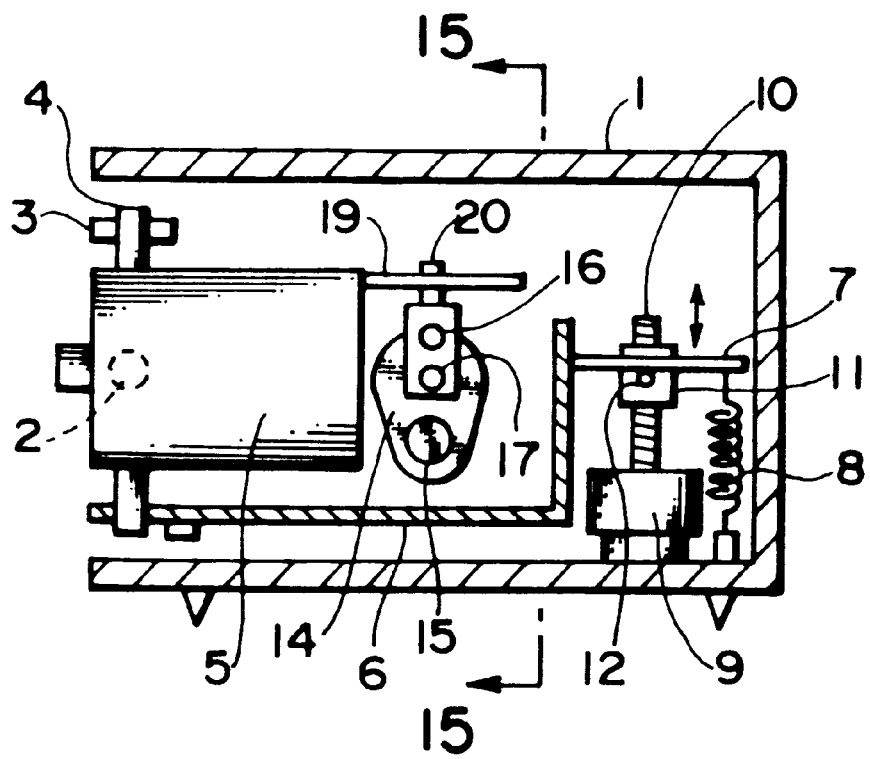
FIG. 13 is a diagram showing an applied example.
Figure 14:
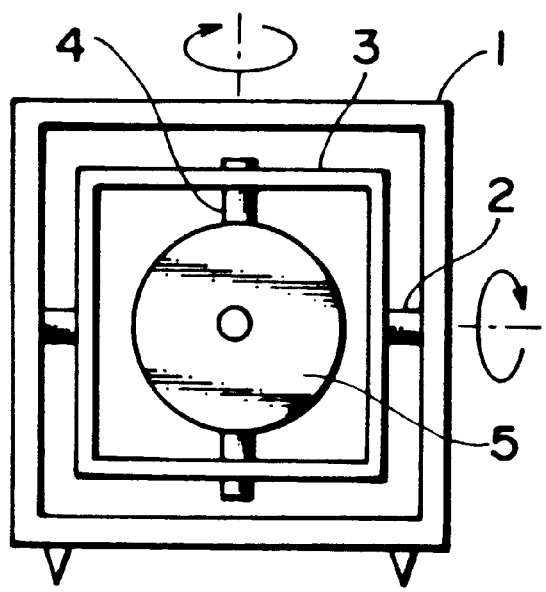
FIG. 14 is a diagram illustrating another applied example.
Figure 15:
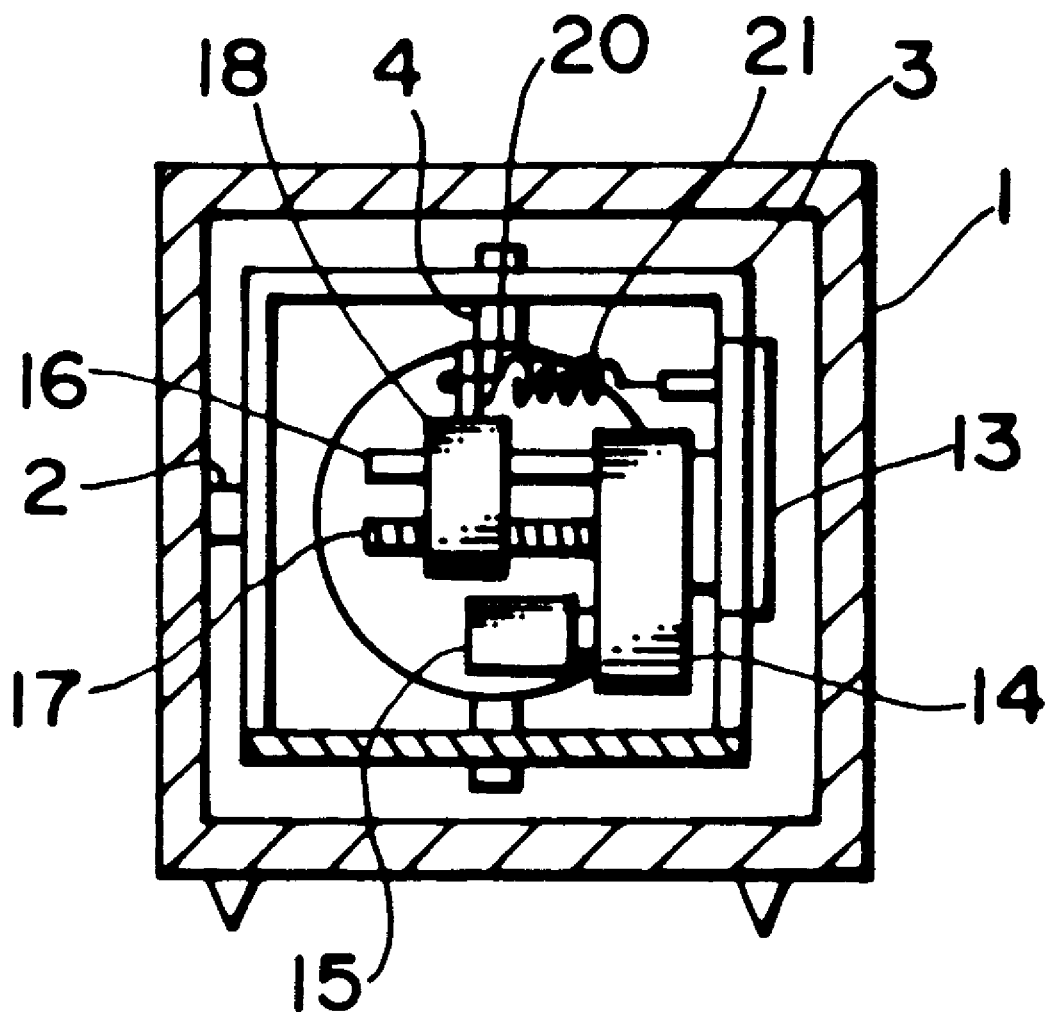
FIG. 15 is a diagram depicting a further applied example.

As shown in FIGS. 13 and 15, the laser irradiating device comprises a frame 1, an elevating frame 3 mounted to the frame 1 so as to be rotatable about a horizontal elevation shaft 2 formed in the vicinity of a front end of the frame 1, and a laser oscillating apparatus 5 formed swingably about a swingable shaft 4 provided in the direction orthogonal to the elevating frame 3.

A horizontal auxiliary frame 6 is provided rearwardly at a lower side portion of the elevating frame 3. A horizontal pin 7 is attached to the horizontal auxiliary frame 6. The pin 7 is coupled to the frame 1 with a spring 8 interposed therebetween and serves so as to urge the elevation frame 3 clockwise under an elastic restoring force of the spring 8.

An elevation screw 10 is upright provided so as to extend in the direction substantially orthogonal to the pin 7. Further, the elevation screw 10 brings a nut 11 maintained in meshing engagement with the elevation screw 10 into engagement with a fixed pin 12 which projects from the nut 11. The elevation screw 10 is coupled to an output shaft of an elevation motor 9 placed on the frame 1 and is able to vary the inclination of the elevation frame 3 under a driving force of the elevation motor 9.

As shown in FIG. 15, a vertical auxiliary frame 13 is mounted to one side of the elevation frame 3. A swing motor 15 is attached to the vertical auxiliary frame 13 with a gear box 14 interposed therebetween. A guide shaft 16 and a swingable screw 17 are provided so as to horizontally extend from the gear box 14. The swingable screw 17 is coupled to an output shaft of the swing motor 15. A nut block 18 brought into meshing engagement with the swingable screw 17 is swingably fit on the guide shaft 16.

A horizontally-protruded pin 19 is horizontally attached to an end portion of the laser oscillating apparatus 5. The pin 19 is brought into engagement with an engagement pin 20 mounted to the nut block 18. An elastic spring 21 is inserted between the pin 19 and the vertical auxiliary frame 13. The laser oscillating apparatus 5 is urged in the horizontal direction, i.e., in the right direction as seen in FIG. 15 under an elastic restoring force of the elastic spring 21.

The laser irradiating device constructed as described above can be rotated in two directions orthogonal to each other under the driving of the elevation motor 9 and the swing motor 15.

Further, FIG. 16 shows an example in which a laser aiming mechanism is used for pipe installation work. A laser irradiating device 2000 provided with the laser oscillating apparatus 1000 according to the present embodiment is used to collimate a target 3000.

A laser beam can be easily applied to the target 3000 even at a bright side against which the sunlight strikes.

According to the present invention constructed as described above, a drive means drives a laser light source so that intermittent pulse light having a predetermined flickering time is produced therefrom. This intermittent pulse light is flickering slower than a flicker value of a normal person in period or cycle. A lighting-out time is set to a time or so required to restore the sensitivity of each eye to the maximum sensitivity after human eyes have felt brightness since light has been launched into the human eyes. Therefore, an advantageous effect can be brought about in that a stimulus can be given to the human eyes at the maximum sensitivity and visibility can be improved even if the surroundings are bright.

According to the present invention as well, a timing circuit forms a timing signal in such a manner that intermittent pulse light having a predetermined flickering time is generated from an excitation type laser light source. A pumping laser pumps the excitation type laser light source based on the signal outputted from the timing circuit. This intermittent pulse light is flickering slower than the flicker value of the normal person in cycle. A lighting-out time is set to a time or so required to restore the sensitivity of each eye to the maximum sensitivity after the human eyes have felt brightness since light has been launched into the human eyes.

The predetermined flickering time employed in the present invention can be also set to a frequency at which an emphasis effect of flickering light can be obtained by Bartley Effect.

Further, according to the present invention, the predetermined flickering time can be also set to a frequency range of 6 Hz to 15 Hz.

If the time required to light or produce the intermittent pulse light employed in the present invention is represented as T, then the time required to light out it can be set to a substantially 2T.

According to a laser-beam producing method of the present invention, a laser light source can generate intermittent pulse light which is flickering slower than a flicker value of a normal person in cycle and has such a flickering time that it corresponds to the time or so required to restore the sensitivity of each eye to the maximum sensitivity after human eyes have felt brightness since light has been launched into the human eyes.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A laser irradiating apparatus comprising:

a laser light source for emitting radiation in the visible spectrum; and a driver circuit for driving said laser light source in a pulsed fashion at a predetermined flickering rate in the range of about 6 to 15 Hz, and having a pulse-off time between consecutive pulses of at least 50 ms, whereby sensitivity of a human eye is restored to a maximum for sensing a pulse after exposure to the preceding pulse.

2. A laser irradiating apparatus comprising:

an excitation-type laser light source;

a pumping laser configured and disposed for pumping said excitation-type laser light source; and a timing circuit for forming a timing signal for activating said pumping laser such that said excitation-type laser light source emits pulsed light in the visible spectrum with a predetermined flickering rate having a pulse-off time between consecutive pulses of at least 50 ms, whereby sensitivity of a human eye is restored to a maximum for sensing a pulse after exposure to the preceding pulse.

3. The laser light-source apparatus according to claim 2, wherein the flickering rate is in a range from 6 Hz to 15 Hz.

4. The laser light-source apparatus according to claim 1 or 2, having a pulse-on time of one-half of said pulse-off time.

5. A method for producing a laser beam, comprising operating a laser light source in the visible spectrum in a pulsed fashion with a predetermined flickering rate of about 6 Hz to about 15 Hz such that a pulse-off time between consecutive pulses is at least 50 ms, whereby sensitivity of a human eye is restored to a maximum for sensing a pulse after exposure to the preceding pulse.

6. The method according to claim 5, wherein operating is such that pulse-on time is one-half of said pulse-off time.

* * * * *